United States Patent
Katori (10) Patent No.: US 10,452,029 B2
(45) Date of Patent: Oct. 22, 2019

(54) OPTICAL LATTICE CLOCK AT OPERATIONAL MAGIC FREQUENCY AND METHOD FOR OPERATING THE SAME

(71) Applicant: RIKEN, Saitama (JP)

(72) Inventor: Hidetoshi Katori, Saitama (JP)

(73) Assignee: RIKEN, Saitama (JP)

( * ) Notice: Subject to any disclaimer, the term of this patent is extended or adjusted under 35 U.S.C. 154(b) by 318 days.

(21) Appl. No.: 15/547,481

(22) PCT Filed: Jan. 28, 2016

(86) PCT No.: PCT/JP2016/053599
§ 371 (c)(1),
(2) Date: Jul. 28, 2017

(87) PCT Pub. No.: WO2016/122001
PCT Pub. Date: Aug. 4, 2016

(65) Prior Publication Data
US 2018/0011449 A1    Jan. 11, 2018

(30) Foreign Application Priority Data
Jan. 30, 2015 (JP) ................. 2015-016480

(51) Int. Cl.
*G04F 5/14* (2006.01)
*H03L 7/26* (2006.01)

(52) U.S. Cl.
CPC . *G04F 5/14* (2013.01); *H03L 7/26* (2013.01)

(58) Field of Classification Search
CPC ..................... G04F 5/14; H03L 7/26
See application file for complete search history.

(56) References Cited

U.S. PATENT DOCUMENTS

| 9,553,597 | B2 | 1/2017 | Katori | |
|---|---|---|---|---|
| 2014/0184216 | A1* | 7/2014 | Walker | G01C 19/62 324/305 |
| 2016/0163407 | A1* | 6/2016 | Kotru | G04F 5/14 250/251 |

FOREIGN PATENT DOCUMENTS

WO    2014/027637 A1    2/2014

OTHER PUBLICATIONS

Affolderbach et al., "Light-shift suppression in laser optically pumped vapour-cell atomic frequency standards," *Applied Physics B* 80:841-848, 2005.

(Continued)

*Primary Examiner* — Jeffrey M Shin
(74) *Attorney, Agent, or Firm* — Seed IP Law Group LLP (57) ABSTRACT

An embodiment of an optical lattice clock comprising atoms and a laser light source at an operational magic frequency is provided. The atoms are capable of making a clock transition between two levels of electronic states, and the laser light source generates at least a pair of counterpropagating laser beams, each of which having a lattice-laser intensity I. The pair of counterpropagating laser beams forms an optical lattice potential for trapping the atoms at around antinodes of a standing wave created by it. The operational magic frequency is one of the frequencies that have an effect of making lattice-induced clock shift of the clock transition insensitive to variation $\Delta I$ of the lattice-laser intensity I, the lattice-induced clock shift being a shift in a frequency for the clock transition of the atoms caused by the variation $\Delta I$ of the lattice-laser intensity I.

15 Claims, 4 Drawing Sheets

(56) References Cited

OTHER PUBLICATIONS

Bloom et al., "An Optical Lattice Clock with Accuracy and Stability at the $10^{-18}$ Level," *Nature* 506:71-75, 2014. (18 pages).
Derevianko et al., "*Colloquium*: Physics of optical lattice clocks," *Reviews of Modern Physics* 83:331-347, 2011.
Ludlow et al., "Systemic Study of the $^{87}$Sr Clock Transition in an Optical Lattice," *Physical Review Letters* 96(033003):1-4, 2006.
Katori et al., "Magic Wavelength to Make Optical Lattice Clocks Insensitive to Atomic Motion," *Physical Review Letters* 103(15):153004-1-153004-4, 2009.
Katori et al., "Spectroscopy of Strontium Atoms in the Lamb-Dicke Confinement," *Proceedings of the 6$^{th}$ Symposium on Frequency Standards and Metrology*, World Scientific Publishing Co., 2002, pp. 323-330 (8 pages).
Katori et al., "Ultrastable Optical Clock with Neutral Atoms in an Engineered Light Shift Trap," *Physical Review Letters* 91(17):173005-1-173005-4, 2003.
McFerran et al., "Neutral Atom Frequency Reference in the Deep Ultraviolet with Fractional Uncertainty=5.7×10$^{-15}$," *Physical Review Letters* 108(18):183004-1-183004-5, 2012.
Ovsiannikov et al., "Multipole, nonlinear, and anharmonic uncertainties of clocks of Sr atoms in an optical lattice," *Physical Review A* 88:013405-1-013405-9, 2013.
Taichenachev et al., "Optical Lattice Polarization Effects on Hyperpolarizability of Atomic Clock Transitions," *Physical Review Letters* 97(17): 173601-1-173601-4, 2006.
Takamoto et al., "An optical lattice clock," *Nature* 435:321-324, 2005.
Ushijima et al., "Cryogenic optical lattice clocks," *Nature Photonics* 9:185-189, 2015.
Westergaard et al., "Lattice-Induced Frequency Shifts in Sr Optical Lattice Clocks at the 10$^{-17}$ Level," *Physical Review Letters* 106(21):210801-1-210801-4, 2011.
Yamanaka et al., "Frequency Ratio of $^{199}$Hg and $^{87}$Sr Optical Lattice Clocks beyond the SI Limit," *Physical Review Letters* 114(23):230801-1-230801-5, 2015.

\* cited by examiner

OPTICAL LATTICE CLOCK AT OPERATIONAL MAGIC FREQUENCY AND METHOD FOR OPERATING THE SAME

TECHNICAL FIELD

The present disclosure relates to an optical lattice clock. More specifically, the present disclosure relates to an optical lattice clock for performing time measurement with reduced uncertainty by using an operational magic frequency and a method for operating the same.

BACKGROUND ART

Atomic clocks have been used for a time reference these days. The atomic clocks are also used in application fields that require high precision in time measurement. They use electromagnetic waves in a microwave range for frequency reference, which waves are produced through transitions between electronic levels in atoms such as Cs (caesium) and Rb (rubidium). For further precise measurement of time, devices called optical clocks have been developed.

The last few years have witnessed significant advances in optical clocks to reach uncertainties of $10^{-18}$ level in ion-based clocks and optical lattice clocks. Hitherto unexplored accuracy of optical clocks opens up new possibilities in science and technologies, such as probing new physics via possible variation of fundamental constants, and relativistic geodesy to measure gravitational potential differences. Evaluations of perturbations on the clock transitions are indeed at the heart of these endeavors.

Unperturbed transition frequencies have been accessed by extrapolating perturbations to zero, which is straight-forward if the correction is proportional to the perturber. Once the dependence becomes nonlinear, such as the blackbody radiation shift that changes as $T^4$ with temperature, dedicated experimental and theoretical investigations are crucial. Contrarily, nonlinear response is leveraged to make the clock transition frequency insensitive to perturbations in hyper-Ramsey spectroscopy.

CITATION LIST

Non Patent Literatures

Non Patent Literature 1: H. Katori, M. Takamoto, V. G. Pal'chikov, and V. D. Ovsiannikov, "Ultrastable Optical Clock with Neutral Atoms in an Engineered Light Shift Trap," Phys. Rev. Lett. 91, 173005 (2003).
Non Patent Literature 2: M. Takamoto, F-L Hong, R. Higashi, and H. Katori, "An optical lattice clock," Nature 435, 321-324 (2005).
Non Patent Literature 3: V. D. Ovsiannikov, V. G. Pal'chikov, A. V. Taichenachev, V. I. Yudin, and H. Katori, "Multipole, nonlinear, and anharmonic uncertainties of clocks of Sr atoms in an optical lattice," Phys. Rev. A 88, 013405 (2013).
Non Patent Literature 4: Hidetoshi Katori, "Spectroscopy of strontium atoms in the Lamb-Dicke confinement," Proceedings of the 6th Symposium on Frequency Standards and Metrology, 323-330 (2002).
Non Patent Literature 5: A. V. Taichenachev, V. I. Yudin, V. D. Ovsiannikov, and V. G. Pal'chikov, "Optical Lattice Polarization Effects on Hyperpolarizability of Atomic Clock Transitions," Phys. Rev. Lett. 97, 173601 (2006).
Non Patent Literature 6: Hidetoshi Katori, Koji Hashiguchi, E. Yu. Il'inova, and V. D. Ovsiannikov, "MagicWavelength to Make Optical Lattice Clocks Insensitive to Atomic Motion," Phys. Rev. Lett. 103, 153004 (2009)
Non Patent Literature 7: Kazuhiro Yamanaka, Noriaki Ohmae, Ichiro Ushijima, Masao Takamoto, and Hidetoshi Katori, "Frequency Ratio of $^{199}$Hg and $^{87}$Sr Optical Lattice Clocks beyond the SI Limit," Phys. Rev. Lett. 114, 230801 (2015)
Non Patent Literature 8: I. Ushijima, M. Takamoto, M. Das, T. Ohkubo, and H. Katori, "Cryogenic optical lattice clocks," Nat. Photonics 9, 185 (2015).
Non Patent Literature 9: J. J. McFerran, L. Yi, S. Mejri, S. Di Manno, W. Zhang, J. Guena, Y. Le Coq, and S. Bize, "Neutral Atom Frequency Reference in the Deep Ultraviolet with Fractional Uncertainty=$5.7 \times 10^{-15}$," Phys. Rev. Lett. 108, 183004 (2012).
Non Patent Literature 10: P. G. Westergaard, J. Lodewyck, L. Lorini, A. Lecallier, E. A. Burt, M. Zawada, J. Millo, and P. Lemonde, "Lattice-Induced Frequency Shifts in Sr Optical Lattice Clocks at the $10^{-17}$ Level," Phys. Rev. Lett. 106, 210801(2011)

SUMMARY OF THE DISCLOSURE

The present inventor has understood and identified the details of some technical problems in the current optical lattice clocks. Optical lattice clocks have aimed at eliminating light-shift perturbations on the clock transition by operating an optical lattice at the magic frequency (Non Patent Literatures 1 and 2), which at first glance should exempt them from evaluating lattice-laser intensity for confining atoms at which the clock transition takes place. However, when uncertainty of the optical lattice clock is to be reduced to less than $1 \times 10^{-15}$ or $1 \times 10^{-16}$ level, it is difficult to determine the optimal lattice frequency to confine atoms just by optimizing in a cut-and-try manner. As will be explained later, the inventor have found that the shift of the clock transition due to the light-shift perturbation depends on the intensity of the lattice laser in a complicated nonlinear manner, which disables linear-extrapolation-to-zero approach and makes the corrections highly delicate issue (Non Patent Literatures 2 and 3). Moreover motion of atoms couples to the optical lattice whose intensity varies in space. Therefore, the lattice-laser intensity I in the optical lattice clocks may vary over a relatively wide range in actual operation conditions and cannot be controlled to an optimal value even when it has been carefully determined.

To be more specific, although a certain intensity is required for the lattice laser to confine the atoms, the intensity actually has spatial distribution. Even in the case the optical lattice is formed by a pair of Gaussian beams, an intensity of a standing wave for the lattice laser decreases as the distance from the optical axis increases. Atoms having interaction with the lattice-laser field are subject to a potential that has a sinusoidal profile along the axis direction with gradually decrease in transverse directions. As a result, the atoms are attracted to anti-nodes of the standing wave while spreading over space to form a lattice arrangement, whose lattice points exist at the anti-node positions, and the atoms are trapped not only by the lattice-laser field near the optical axis, but by the lattice-laser field with decreased intensity at positions away from the axis in radial direction. In the case the optical lattice is formed with more than two pairs of laser beams that forms two- or three-dimensional optical lattice, the variation of the lattice-laser intensity may have more significant variation than for a case with a single pair of laser beams forming a one-dimensional optical lattice. It is therefore beneficial to develop practically useful optical lattice clocks in consideration of possible distribution or variations of the lattice-laser intensity.

The present disclosure solves the problems mentioned above and others. The present disclosure provides an approach for realizing an optical lattice clock operable with reduced systematic uncertainty regarding a light shift in the clock transition, which is hereinafter referred to as a clock shift.

Solution to the Problem

The present inventor proposes strategies to eliminate clock shifts caused by perturbations due to an optical lattice without relying on a conventional zero-extrapolation approach or to alleviate effects resulting from such clock shifts. It is shown that lattice-laser frequency and light-polarization-dependent hyperpolarizability effect may be used to tailor intensity dependence of clock shifts.

That is, in one aspect of the present disclosure provided is an optical lattice clock comprising: atoms capable of making a clock transition between two levels of electronic states; and a laser light source at an operational magic frequency for generating at least a pair of counterpropagating laser beams, each of which having a lattice-laser intensity I, wherein the pair of counterpropagating laser beams forms an optical lattice potential for trapping the atoms at around anti-nodes of a standing electromagnetic wave of the counterpropagating laser beams, wherein the operational magic frequency is a frequency that makes a lattice-induced clock shift of the clock transition insensitive to variation $\Delta I$ of the lattice-laser intensity I, the lattice-induced clock shift being a shift in a frequency for the clock transition of the atoms caused by the variation $\Delta I$ of the lattice-laser intensity I due to AC Stark effect on the two levels of the electronic states.

In the aspect of the present disclosure mentioned above, an "operational magic frequency" is utilized in operating the optical lattice clocks, with which frequency a lattice-induced clock shift is reduced over a wide range of lattice-laser intensity I. The clock shift denotes a shift in the clock transition frequency due to variation $\Delta I$ of the lattice-laser intensity I. The operational magic frequency is introduced based on newly developed strategies that allow for a possible variation $\Delta I$ in the actual operation condition, which may reduce the clock shift to less than $1\times10^{-18}$ accordingly. It should be noted that, the transition relevant to the time measurement may be referred to as a "clock transition," and associated electronic levels or states may be called "clock states." The atoms related to this type of clocks may include not only atoms but their ions as well. Furthermore, customary terminologies in this art of technology are adopted in the present application, unless such terms may render the description indefinite. For example, terms related to electromagnetic wave emission outside of visible range, such as emission in infrared or ultraviolet range, may be referred to "light", "laser", "light source" or the like based on terms in the field of optical technology.

Advantageous Effects of the Disclosure

In accordance with an aspect of the present disclosure, a highly practical optical lattice clock and method for operating the same is provided. In one example, a design strategy is provided with respect to highly practical optical lattice clocks that allow us to operate them with a well-defined operation over an extended range of lattice-laser intensity while assuming necessary corrections on the clock frequency values. Another example with another design strategy is provided also for a highly practical optical lattice clock that allows us to operate the clock with a well-defined operation over an extended range of lattice-laser intensity without requiring correction to the clock frequency values with minimized uncertainty. Consequently, optical lattice clocks using several types of atom can be operated with reduced systematic uncertainty of less than $10^{-17}$, as an example.

DESCRIPTION OF THE EMBODIMENTS

An embodiment of an optical lattice clock of the present disclosure is described below by referring to the drawings. In the following description, common parts or elements are indicated by common reference numerals over the entire drawings unless otherwise noted. In addition, each element in the drawings is not necessarily drawn to scale.

1. Structure of Optical Lattice Clock

Figure 1:
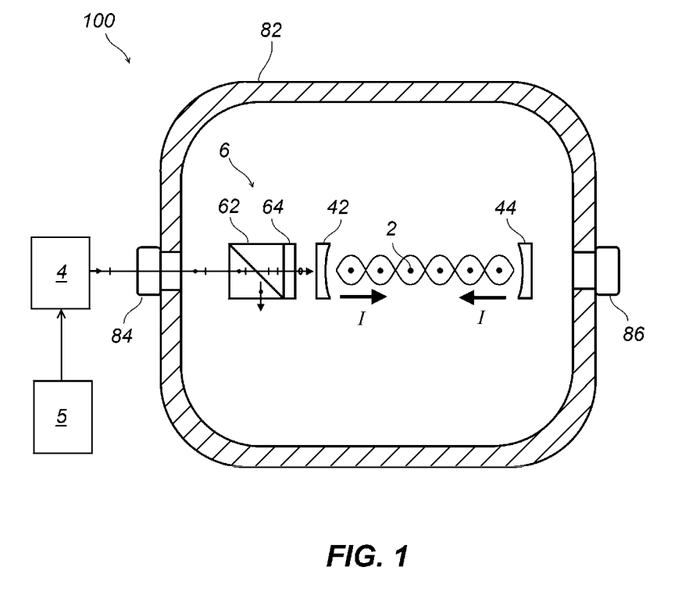
FIG. 1 is a schematic diagram indicating an example structure of the optical lattice clock of the present embodiment.

FIG. 1 is a schematic diagram indicating an example structure of the optical lattice clock of the present embodiment. An optical lattice clock 100 measures transition frequency between electronic states of atoms 2. The atoms 2 are selected from a group of atoms or ions having clock transitions between long-lived states, and, in particular, from a group consisting of ytterbium (Yb), mercury (Hg), strontium (Sr), cadmium (Cd), zinc (Zn), magnesium (Mg), and calcium (Ca). Among the transitions of the electronic states of the atoms 2, a transition whose transition frequency is measured using laser spectroscopy is referred to as a clock transition.

The atoms 2 are supplied into a vacuum space inside of a vacuum chamber 82 while their thermal motion has been sufficiently suppressed by way of laser cooling, Doppler cooling or the like. The supplied atoms 2 are then trapped after interacting with electric field of a standing wave produced by a pair of counterpropagating laser beams fed by the lattice laser 4 whose frequency is precisely controlled by a frequency controller 5. To form the standing wave, mirrors 42 and 44 are placed in the vacuum space. A shape of the potential due to interaction between the atoms 2 and standing wave has minimums at anti-nodes of electric field in the standing wave, which exerts attractive forces on the atoms 2 with restoring force potential centered at each of the anti-nodes. Electric field in the standing wave of the laser light has strong and weak alternating pattern along a beam axis direction, whereas it has gradually decaying pattern when traced to the radial direction from the beam axis, when Gaussian mode is excited as a typical implementation. The transition frequency $\nu_0$ of the clock transition of the atoms 2 suffers from a shift $\Delta\nu_c$, or a "lattice-induced clock shift $\Delta\nu_c$," due to perturbation from the lattice-laser light, which has been called AC Stark effect. It should be noted that any frequency shift in the clock transition that depends on the lattice-laser intensity through perturbation from the lattice laser will be referred to as the lattice-induced clock shift.

1-1. Magic Wavelength and Zero-Extrapolation Approach

It has been found by the inventor that the lattice-induced clock shift may be minimized if the frequency of the lattice laser 4 for trapping is determined and controlled carefully, where the frequency thus determined has been called a magic frequency. The present inventor and others reported in Non Patent Literature 4 that the lattice-induced clock shift $\Delta\nu_c$ depends on laser intensity from the lattice laser 4, or lattice-laser intensity, and that the stronger the intensity of the lattice laser is, the more significant the lattice-induced clock shift $\Delta\nu_c$ becomes for a frequency determined with less attention. In addition, the experiment reported in Non Patent Literature 4 has revealed that there is found a frequency for the lattice laser 4 that totally eliminates dependence of the lattice-induced clock shift $\Delta\nu_c$ on the lattice-laser intensity over a certain intensity range, and such a frequency has been referred to as the magic frequency, as stated above. For describing the strategy the feasibility is demonstrated based on a theoretical analysis. Thereafter, the effectiveness of the analysis has been confirmed through experiments. Furthermore, the approach to $10^{-19}$ level with the proposed strategy is explained.

1-2. Operational Magic Frequency

The present inventor reviewed the concept of the magic frequency in detail from a theoretical viewpoint as to how much the lattice-induced clock shift could be reduced, based on our previous approach in Non Patent Literature 3. This is because, according to an experimental fact that the lattice-induced clock shift increases as the intensity of the lattice laser increases, it follows that, the lattice-induced clock shift might well be reduced if the lattice laser is sufficiently weakened ("zero-extrapolation approach"). However, when the lattice laser was actually reduced according to the zero-extrapolation approach, there was found another problem in that the clock shift failed to decrease to zero in a linearly proportional manner as the lattice-laser intensity was reduced. Therefore further in-depth theoretical analysis has been conducted on the clock shift, and as a result, it has been found that residual clock shifts arising from hyperpolarizability and multipolar effect may manifest as leading systematic uncertainties at low $10^{-17}$. Moreover, we have found an approach for specifying a magic frequency that is more suitable for operation with finite or nonzero lattice-laser intensity, which is called an "operational magic frequency". The concept leading to the operational magic frequency will be described below with the help of the study in Non Patent Literature 3. Numerical calculated results for electric-dipole (E1), magnetic-dipole (M1), and electric-quadrupole (E2) polarizabilities and hyperpolarizabilities will be presented for the $^1S_0$-$^3P_0$ clock transitions in Sr, Yb, and Hg atoms.

1-3. Lattice Induced Clock Shifts: Formulation

Figure 2:
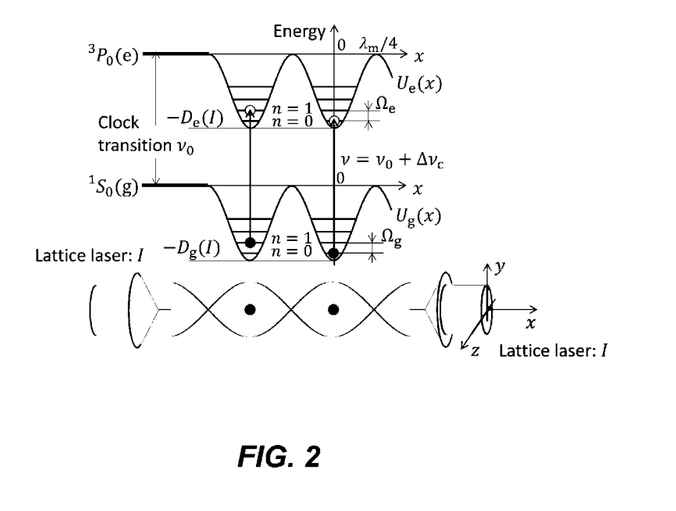
FIG. 2 is an illustration depicting atoms trapped to an optical lattice formed by lattice-laser beams and related clock transition schemes.

The lattice-induced clock shift is given by the difference between the AC Stark energies in the ground (g) and excited (e) clock states. They are determined by the interaction between a trapped atom and a standing-wave field, $$E(x,t)=2E_0 \cos kx \cos \omega t, \quad (1)$$

which consists of counterpropagating laser waves with electric field vector $E_0$ (corresponding intensity, or the lattice-laser intensity, I), frequency $\omega$, and wavevector $k=\pm k e_x$ with $k=\omega/c$ and c the speed of light, as depicted in FIG. 2.

FIG. 2 indicates atoms trapped to an optical lattice formed by lattice-laser beams and related clock transition schemes. An atom trapped in $U_g$ with $|x|<<\lambda_m/4$ is excited on the $^1S_0(g) \rightarrow {}^3P_0(e)$ clock transition with unperturbed frequency $\nu_0$ and a lattice-induced clock shift $\Delta\nu_c$. In Gaussian beam implementation, actual laser beams show transverse intensity distribution I $\exp(-2(y^2+z^2)/r_0^2)$ with beam radius $r_0 \kappa \lambda$, which weakly confines atoms transversely. The atom-lattice interaction is determined by the operator V (x, t)=Re[V (x) $\exp(-i\omega t)$] with the spatial factor $$V(x)=V_{E1} \cos kx+(V_{E2}+V_{M1})\sin kx, \quad (2)$$

where $V_{E1}$, $V_{E2}$, and $V_{M1}$ correspond to operators of E1, E2, and M1 interactions, respectively. Hereinafter, a lattice-induced clock shift may be referred simply as a clock shift.

The second- and fourth-order terms of atom-lattice interaction energy V (x) correspond to linear and quadratic terms in lattice-laser intensity I. The optical lattice potential for an atom at $|x| \varphi \lambda=2/k$ (see FIG. 2) is given by $$U_{g(e)}(x,I) \approx -D_{g(e)}(I)+u^{(2)}_{g(e)}(I)x^2-u^{(4)}_{g(e)}(I)x^4+\ldots \quad (3)$$

with potential depth given by $$D_{g(e)}(I) \approx -U_{g(e)}(x,I)=\alpha_{g(e)}^{E1}(\omega)I+\beta_{g(e)}(\omega,\xi)I^2, \quad (4)$$

which is determined by the electric-dipole polarizability $\alpha_{g(e)}^{E1}(\omega)$ I and hyperpolarizability $\beta_{g(e)}(\omega,\xi)$, with $\xi$ the degree of circular polarization of light as discussed later in this section. In the description of this application, a combined subscript, such as g(e), is used for simplicity.

The coefficient for the harmonic term in Eq. (3), $$u^{(2)}_{g(e)}(I) = [\alpha_{g(e)}^{dqm}(\omega)I + 2\beta_{g(e)}(\omega, \xi)I^2]k^2 = \frac{M\Omega^2_{g(e)}(I)}{2} \quad (5)$$

determines the vibrational frequency $\Omega_{g(e)}(I)$ of atoms in the lattice. In terms of the photon-recoil energy $E_R=(\hbar k)^2/2M$ with M the atomic mass and $\hbar=h/2\pi$ the Planck constant, the vibrational frequency is given by $$\Omega^2_{g(e)}(I) = \frac{2}{\hbar}\sqrt{E_R[\alpha_{g(e)}^{dqm}(\omega)I + 2\beta_{g(e)}(\omega, \xi)I^2]}, \quad (6)$$

where a combined E1-E2-M1 polarizability $$\alpha_{g(e)}^{dqm}(\omega)=\alpha_{g(e)}^{E1}(\omega)-\alpha_{g(e)}^{qm}(\omega) \quad (7)$$

is defined due to the quarter-period offset of E1 and multipolar (E2-M1) interactions of an atom with the standing wave, where $\alpha_{g(e)}^{qm}(\omega)=\alpha_{g(e)}^{E2}(\omega)+\alpha_{g(e)}^{M1}(\omega)$ is the sum of E2 and M1 polarizabilities. The lowest-order anharmonic correction in the lattice is given by $$u_{g(e)}^{(4)}(I) = \left[\alpha_{g(e)}^{dqm}(\omega)I + 5\beta_{g(e)}(\omega,\xi)I^2\right]\frac{k^4}{3}. \tag{8}$$

The energy of an atom in the n-th vibrational state $|n\rangle$ is calculated to be $$E_{g(e)}^{vib}(I,n) = -D_{g(e)}(I) + \hbar\Omega_{g(e)}(I)\left(n+\frac{1}{2}\right) - E_{g(e)}^{(4)}(I)\left(n^2+n+\frac{1}{2}\right), \tag{9}$$

where the second term corresponds to the harmonic-oscillator energy and the last term the anharmonic correction given by $$E_{g(e)}^{(4)}(I) = \frac{E_R}{2}\left[1 + \frac{3\beta_{g(e)}(\omega,\xi)I}{\alpha_{g(e)}^{dqm}(\omega)}\right]. \tag{10}$$

The lattice-induced clock shift is given by the difference of energies Eq. (9) for the atom in its ground and excited states with vibrational state $|n\rangle$ being unchanged (the Lamb-Dicke regime). The clock shift is given by $$h\Delta v_c(I,n) = E_e^{vib}(I,n) - E_g^{vib}(I,n) = \tag{11}$$
$$-\Delta D(I) + \hbar\Delta\Omega(I)(n+1/2) - \Delta E^{(4)}(I)(n^2+n+1/2),$$

where we define $\Delta D(I) = D_e(I) - D_g(I)$, $\Delta\Omega(I) = \Omega_e(I) - \Omega_g(I)$, and $\Delta E^{(4)}(I) = E_e^{(4)}(I) - E_g^{(4)}(I)$.

The hyperpolarizabilities depend on the lattice-laser ellipticity in addition to its frequency, and are given by $$\beta_{g(e)}(\omega,\xi) = \beta_{g(e)}^1(\omega,\xi) + \xi^2[\beta_{g(e)}^c(\omega) - \beta_{g(e)}^1(\omega)], \tag{12}$$

where $\beta_{g(e)}^{1(c)}(\omega)$ is the hyperpolarizability for linear (circular) polarized light. The degree of circular polarization is defined by $\xi = \sin 2\chi$, where $\tan\chi$ determines the ratio of the minor to major axis of the polarization ellipse with ellipticity angle defined in $0 \leq \chi \leq \pi/4$. When $\Delta\beta^1$ $(=\beta_e^1-\beta_g^1)$ and $\Delta\beta^c$ $(=\beta_e^c-\beta_g^c)$ have opposite signs, there exists a "magic ellipticity" determined by $\xi_m = 1/(1-\Delta\beta^c/\Delta\beta^1)^{1/2}$ (see, Non Patent Literature 5), which eliminates the differential hyperpolarizability $\Delta\beta(\xi) = \Delta\beta^1 + \xi^2(\Delta\beta^c - \beta^1)$ (Eq. (12)).

The theoretical framework of the Non Patent Literature 3 as described above has been used for investigating governing principle of the clock shift in the actual optical lattice clocks. Since the effect of multipolar interactions and hyperpolarizabilities are taken into account in addition to the electric-dipole effect, the formulae presented Eqs. (1)-(12) presumes all possible conditions with little approximation. However, when applying the framework to the actual optical lattice clocks with tailored intensity dependence of clock shifts, it is necessary to derive more straightforward relationship between the clock shifts and the lattice-laser intensity I. The more important consequence in this respect is the tunability of $\Delta\beta(\xi)$ between $\Delta\beta^1$ and $\Delta\beta^c$, which will be clarified for the following.

1-4. Clock Shift Dependence on Lattice-Laser Intensity

In order to clarify the clock shift dependence on the lattice-laser intensity I, approximation on the clock shift (Eq. (11)) is made while assuming experimentally feasible lattice-laser intensities to trap laser-cooled atoms. The following quantities are about $10^6$ times smaller than the electric-dipole polarizability $\alpha_{g(e)}^{E1} \approx \alpha^{E1}$: (i) the E2-M1 polarizabilities $\alpha_{g(e)}^{qm} = \alpha_{g(e)}^{E2} + \alpha_{g(e)}^{M1}$, (ii) the hyperpolarizability effect $\beta_{g(e)}I$, and (iii) the differential dipole polarizability $$\Delta\alpha^{E1} = \alpha_e^{E1} - \alpha_g^{E1} = \frac{\partial\Delta\alpha^{E1}}{\partial\omega}\delta\omega.$$

The clock shift is then expanded in Taylor series in the vicinity of $\omega \approx \omega_m^{E1}$ and neglecting higher order terms, $$h\Delta v_c(I,n,\delta v,\xi) = \tag{13}$$
$$c_{1/2}I^{1/2} + c_1 I + c_{3/2}I^{3/2} + c_2 I^2 \approx \left(\frac{\partial\Delta\alpha^{E1}}{\partial v}\delta v - \Delta\alpha^{qm}\right)(2n+1)$$
$$\sqrt{\frac{E_R}{4\alpha^{E1}}}I^{1/2} - \left[\frac{\partial\Delta\alpha^{E1}}{\partial v}\delta v + \Delta\beta(\xi)(2n^2+2n+1)\frac{3E_R}{4\alpha^{E1}}\right]I +$$
$$\Delta\beta(\xi)(2n+1)\sqrt{\frac{E_R}{\alpha^{E1}}}I^{3/2} - \Delta\beta(\xi)I^2,$$

where $\delta v (= \delta\omega/2\pi)$ is a lattice-laser detuning from the "E1-magic frequency" defined by $\Delta\alpha^{E1}(\omega_m^{E1}) = 0$, and $\Delta\alpha^{qm} = \alpha_e^{qm} - \alpha_g^{qm}$ is the differential multipolar polarizability. Note that the first term for $I^{1/2}$ stands for multipolar effects that originate from $\alpha_{g(e)}^{qm} I \sin^2(kx)$ modulation on the potential to atoms, and that the third and fourth terms of $I^{3/2}$ and $I^2$ as well as the second half of the second term of I the hyperpolarizability effects, which originates from potential modulation factor of, such as $\beta I^2 \cos^4(kx)$ for $I^2$. The remaining term, the first half of the second term proportional to I, includes the detuning of the lattice-laser frequency $\delta v$, with its proportionality coefficient being a differential derivative of the differential dipole polarizability over the lattice-laser frequency v. In the case there is no need to consider the multipolar or hyperpolarizability effect, such as the target uncertainty remains $10^{-15}$ level, the clock shift $\Delta v_c$ is governed by the proportional dependence on the lattice-laser intensity I, which is determined by the differential derivative. Thus, it is useful to introduce the E1-magic frequency, from which the optimal frequency for the lattice is sought by accounting for the multipolar and hyperpolarizability effects. From the differential derivative in Eq. (13), the E1-magic frequency denotes a frequency of the lattice laser that exactly matches two electric-dipole components for the ground and excited states of the clock transition.

The magic frequency $\omega_m/2\pi (=c/\lambda_m)$ is so far aimed at minimizing $c_1$, which dominates Eq. (13), by tuning $\omega_m \rightarrow \omega_m^{E1}$ (see, Non Patent Literature 1). However, it should be emphasized that this protocol is no longer valid for fractional uncertainty $\Delta v_c/v_0 \sim 10^{-17}$ as the other $c_j I_j$ terms equally contribute. In other words, the theoretical finding of Eq. (13) based on the rigorous evaluation of the perturber gives a more comprehensive picture to the dependence of the lattice-induced clock shift $\Delta v_c$ on the lattice-laser intensity I than one with the zero-extrapolation approach.

As a measure to evaluate applicability of "E1-magic frequency" by neglecting multi-polar effect, it is possible to define a merit factor $\kappa \equiv \alpha^{E1}/|\Delta\alpha^{qm}|$. The $\kappa$ values for Sr, Yb, and Hg obtained through the foregoing calculation are $3.3 \times 10^7$, $2.4 \times 10^7$, and $6.9 \times 10^5$, respectively. The reciprocal of the merit factor $\kappa^{-1}$ indicates the fractional contribution of the E2-M1 effect that introduces atomic-motion-induced $I^{1/2}$ nonlinearity. Since typical clock experiments are performed in a relatively low intensity regime ($\beta I \leq \alpha^{qm}$), large κ values for Sr and Yb may validate a linear extrapolation of the clock shifts down to the $10^{-17}$ level. However, when the merit factor decreases, such as for Hg, or when the extreme exclusion of the uncertainty is targeted for Sr and Yb, this simple approach breaks down and new strategies are required.

1-5. Application of Operational Magic Frequency to Atoms

In order to evaluate feasibility of the optical lattice clock of the present embodiment, it is useful to assume a realistic clock operation and apply the dependence of the clock shift $\Delta v_c$ on the operational lattice-laser intensity I in Eq. (13) with parameters for real atoms. It is apparent that there is no "magic condition" that sets four coefficients $c_j \to 0$ in Eq. (13), as there are only three free parameters n, δv, and available. Consider that an operational lattice-laser intensity $I_{op}$ is naturally determined so as to trap Doppler-cooled atoms $D_{g(e)} \approx \alpha^{E1} I_{op} \sim 5 k_B T$ with temperatures of T~1 μK, 4 μK and 30 μK for Sr, Yb, and Hg, respectively. We may then tune δv and ξ to minimize the lattice-induced clock shift $\Delta v_c$ for $I_{op} \pm \Delta I$ with ΔI as wide as possible, as the laser intensity is spatially non-uniform. Actual one-dimensional optical lattices employ Gaussian beams with an intensity profile I $\exp(-2(y^2+z^2)/r_0^2)$ and a beam radius $r_0 \kappa \lambda$ to confine thermal motion of atoms in the transverse direction (see FIG. 2), which inevitably introduces intensity inhomogeneity of $\Delta I/I \approx k_B T/D_{e(g)}$. In the following analysis, to simplify the explanation, we assume atoms to be in the vibrational ground state (n=0) along x-axis by applying a sideband cooling. We then look for conditions that satisfy both $$\left.\frac{\partial \Delta v_c(I, \delta v, \xi)}{\partial I}\right|_{I=I_{op}} = 0$$

and $\Delta v_c(I_{op}, \delta v, \xi)=0$.

1-5-1. Mercury

Figure 3:
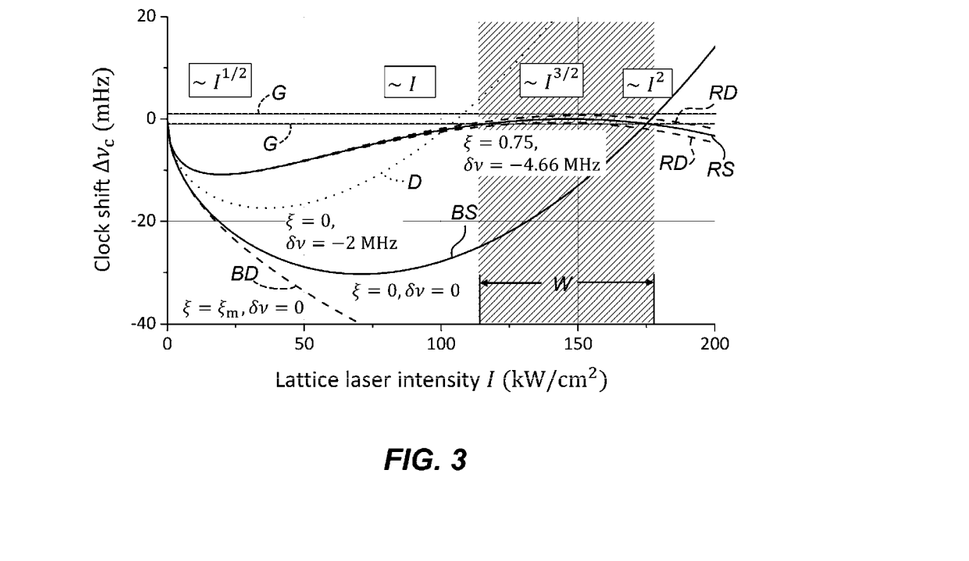
FIG. 3 is a graph showing dependence of lattice-induced clock shifts of Hg on the lattice-laser intensity I.

FIG. 3 is a graph illustrating intensity dependence of the lattice-induced clock shifts $\Delta v_c^{Hg}(I)$ for Hg, on the lattice-laser intensity I calculated by Eq. (13). For low lattice-laser intensity, $I^{1/2}$ behavior dominates, whose coefficient $c_{1/2}$ is determined by the electric-dipole $$\left(\frac{\partial \Delta \alpha^{E1}}{\partial v} \delta v\right)$$

and multipolar ($\Delta \alpha^{qm}$) polarizabilities. For intermediate intensity where clocks operate, the leading term proportional to I is determined by the electric-dipole polarizability and slightly by the hyperpolarizability $\Delta \beta(\xi)$ effect via the anharmonic correction (Eq. (10)); in addition, the $I^{3/2}$ and $I^2$ terms depend on $\Delta \beta(\xi)$.

The line RS in FIG. 3 shows the clock shift $\Delta v_c^{Hg}(I)$ with δv=−4.66 MHz and $\xi^{Hg}$=0.75, which demonstrates that the clock shift becomes less than 1 mHz corresponding to fractional uncertainty of $1 \times 10^{-18}$ for 115 kW/cm² <I<177 kW/cm². The lines BS and BD correspond to linear-polarized and "magic-elliptical" light with the lattice-laser detuning δv=0. With δv=−4.66 MHz and $\xi^{Hg}$=0.75, the clock shift (line RS) becomes less than ±1 mHz (lines G) for a range W of the lattice-laser intensity I. The lines RD indicate the tolerance (0.5%) for $\xi^{Hg}$. For linear polarized light (ξ=0) with δv=−2 MHz, the light shift becomes insensitive to ΔI around I~36 kW/cm² (line D). Almost the same dependency is obtained for a slightly modified set of conditions, δv=−4.65 MHz and $\xi^{Hg}$=0.892, with less than 1 mHz clock shift for 115 kW/cm² <I<180 kW/cm², though it is not shown in the drawing.

As is indicated in FIG. 3, each lattice-induced clock shift $\Delta v_c^{Hg}(I)$ in FIG. 3 with different combination of the lattice-laser detuning δv and the degree of circular polarization $\xi^{Hg}$ has its own dependence on the lattice-laser intensity I. Furthermore, it possible to find a combination of the clock shift $\Delta v_c^{Hg}(I)$ and the lattice-laser detuning δv that substantially satisfies $$\left.\frac{\partial \Delta v_c(I, \delta v, \xi)}{\partial I}\right|_{I=I_{op}} = 0$$

and $\Delta v_c(I_{op}, \delta v, \xi)=0$ at a time. Since the line RS with this combination allows us to operate the clock with a smaller uncertainty for an extended range $W=I_{op}-\Delta I \sim I_{op}+\Delta I$ around the lattice-laser intensity $I_{op}$ than a predetermined uncertainty level, the magic frequency with a lattice-laser detuning δv=−4.66 MHz from the "E1 magic frequency" with the help of the degree of circular polarization $\xi^{Hg}$=0.75 is an example of possible operational magic frequencies for Hg in this embodiment.

1-5-2. Ytterbium

Figure 4A:
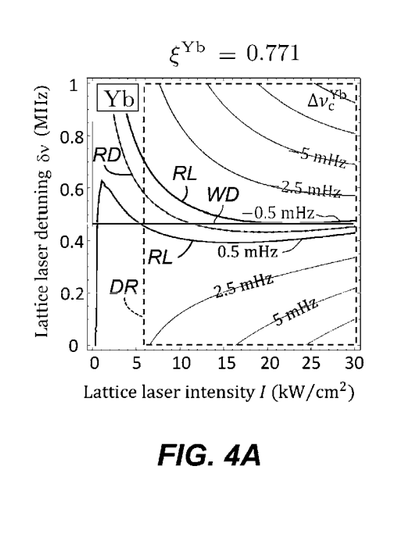
FIGS. 4A and 4B are contour plots of clock shift values for Yb as a function of the lattice-laser intensity I and lattice-laser detuning $\delta v$ for $\xi^{YB}=0.771$ and 0.75, respectively.
Figure 4B:
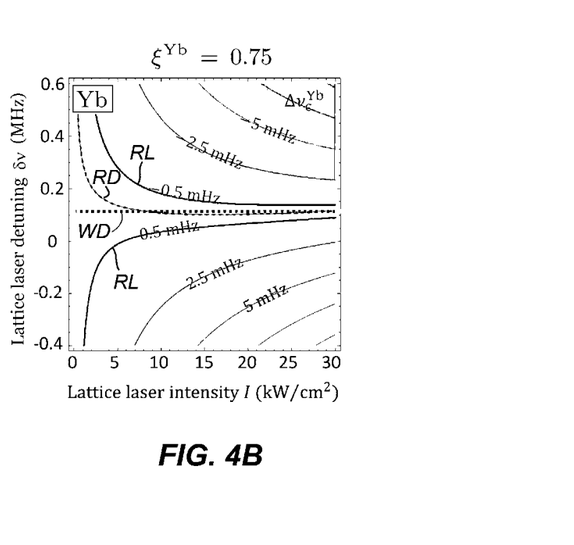

FIGS. 4A and 4B are contour plots of clock shift values for Yb, calculated by Eq. (13), as a function of the lattice-laser intensity I and lattice-laser detuning δv for $\xi^{Yb}$=0.771 and 0.75, respectively. Lines RD indicate where the clock shift is 0, and the region bound by lines RL corresponds to the clock shift uncertainty $|\Delta v_c(I, \delta v)|/v_0 < 1 \times 10^{-18}$. FIG. 4A calculates the clock shift $\Delta v_c^{Yb}(I, \delta v)$ of Yb, for $\xi^{Yb}$=0.771, which indicates that the lattice-laser detuning of δv=0.45 MHz allows $|\Delta v_c^{Yb}(I, \delta v)|/v_0^{Yb} < 1 \times 10^{-18}$ for 6 kW/cm² <I<30 kW/cm². The line WD is placed at the lattice-laser detuning δv, and the dashed rectangle DR spans corresponding lattice-laser intensity range for graphical indications. For 0.5% change in $\xi^{Yb}$, not shown in the drawing, applicable intensity range is reduced to ΔI<15 kW/cm² by allowing fractional uncertainty to $2 \times 10^{-18}$. Likewise, FIG. 4B calculates the clock shift $\Delta v_c^{Yb}(I, \delta v)$ of Yb, for $\xi^{Yb}$=0.75, where a slight difference from the magic ellipticity $\xi_m^{Yb}$=0.7516 compensates the multipolar effect. With a lattice-laser detuning of δv=0.11 MHz (line WD), the clock shift uncertainty $|\Delta v_c^{Yb}(I, \delta v)|/v_0^{Yb}$ can be well less than $1 \times 10^{-18}$ for an entire lattice-laser intensity I shown in the plot. For 0.5% variation in $\xi^{Yb}$, the corresponding lattice-laser intensity range is reduced to I<12 kW/cm² by allowing fractional uncertainty to $1 \times 10^{-18}$. The vector clock shift arising from the elliptical light may be canceled out by averaging the clock transitions with Zeeman sub states m=±½. $^{171}$Yb and $^{199}$Hg with nuclear spin of ½ are the best candidates for this scheme because of the lack of tensor clock shift. The above-mentioned slight but noticeable deviation of the degree of circular polarization away from the magic ellipticity allows compensation of the multipolar polarizabilities. This is an example that the range of intensity accepted for the lattice-laser intensity, or acceptable tolerance, may be increased by adjusting the degree of circular polarization.

1-5-3. Strontium

Figure 5:
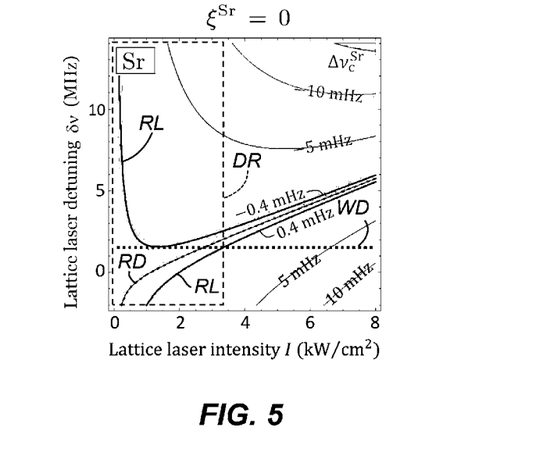
FIG. 5 is a contour plot of clock shift values for Sr as a function of the lattice-laser intensity I and lattice-laser detuning $\delta v$ for $\xi^{Sr}=0$.

FIG. 5 is a contour plot of $|\Delta v_c^{Sr}(I, \delta v)|/v_0^{Sr}$ for Sr for $\xi^{Sr}$=0, to which the same indications for graph axes and lines as FIGS. 4A and 4B should apply. The sign of hyperpolarizability is not tunable for Sr. However, as shown in FIG. 5, $|\Delta v_c^{Sr}(I, \delta v)|/v_0^{Sr} < 1 \times 10^{-18}$ holds for $0 < I < 3.3$ kW/cm² for a linear-polarized lattice ($\xi = 0$) with $\delta v = 1.5$ MHz, which makes Sr an attractive candidate. Its very low Doppler temperature allows Sr lattice to operate at low lattice-laser intensity $I \approx 2.3$ kW/cm², where high merit factor $\kappa_{Sr}$ keeps the multipolar effect small and the hyperpolarizability effect does not come into play. Similar low intensity optimization is applicable to Yb and Hg at the expense of lattice-trapped atoms or by applying deep laser-cooling on the $^1S_0$-$^3P_0$ clock transitions.

1-6. Operational Magic Frequency in Practice

To clarify scope of the embodiment covered by the concept set forth in the above with several types of atoms, the requirements used for the operational magic frequency will be revisited in this section. Optical lattice clocks may also be operated with an optimal lattice-laser detuning $\delta v_{op}$, determined as $$\frac{\partial \Delta v_c(I, \delta v_{op})}{\partial I}\bigg|_{I=I_{op}} = 0$$

in cases when the hyperpolarizability is not tunable and/or the optical lattice is limited to be a linear-polarized lattice ($\xi = 0$) to alleviate experimental issues. Although the clock transition may suffer from a nonzero, finite correction $\Delta v_c(I_{op}, \delta v_{op})$, the scheme would be also applicable because the clock shift becomes insensitive to lattice-laser intensity at least for a certain range as seen in lines BS and D in FIG. 3. For example, in the case of an Hg lattice clock using a linearly polarized light ($\xi^{Hg} = 0$) with zero detuning ($\delta v = 0$) in the lattice laser, an extended range of intensity for the lattice-laser intensity, or acceptable tolerance, should be achieved with the lattice-laser intensity I of around 75 kW/cm², if $-30$ mHz correction is acceptable in determining the clock frequency as can be seen from FIG. 3. Similarly, another Hg lattice clock with a linearly polarized light of $\xi^{Hg} = 0$ and a lattice-laser detuning of $\delta v = -2.0$ MHz should also have an extended acceptable tolerance for the lattice-laser intensity I by setting the lattice-laser intensity to around 40 kW/cm², which then requires $-18$ mHz correction for the clock shift $\Delta v_c$. Therefore, it is important to control the laser frequency of the lattice laser 4 (FIG. 1) with MHz level when the optical lattice clock is operated at the operational magic frequency. A controller 5 in the optical lattice clock 100 manages the frequency of the lattice laser 4 for this operation by referencing any sort of frequency reference, not shown, with the help of an optical comb technique. The frequency of the lattice laser 4 can be easily controlled with an accuracy of around 150 kHz, typically.

Requirements for the optimal setting of the lattice-induced clock shift $\Delta v_c$ derived from $$\frac{\partial \Delta v_c(I, \delta v_{op})}{\partial I}\bigg|_{I=I_{op}} = 0$$

may be described, in an alternative way, as lattice-induced clock shift $\Delta v_c$ should be insensitive to the variation $\Delta I$ of the lattice-laser intensity I. When the lattice-induced clock shift $\Delta v_c$ satisfies this requirement, the correction to the lattice-induced clock shift $\Delta v_c$ mentioned above can be accomplished merely by shifting the clock frequency by a known value, which is a well-defined operation without substantial degradation to the clock performance. The correction of this sort could be carried out at any time after detecting the clock transition. It should be noted that, such a shift may require correction of the clock transition frequency, but does not increase any uncertainty in the clock frequency. Therefore, the present embodiment can be implemented not only with a set of conditions that yields line RS for Hg in FIG. 3, which touches to the zero clock shift, or $\Delta v_c = 0$, at a point in a range W, but with ones that correspond for the two curves, lines D and BS for the linearly polarization ($\xi = 0$) where the lines extend along parallel direction to the intensity axis I. Similar shifts in the clock frequency are also allowed for other atoms as well with other conditions. As can be indicated in the contour plots in FIGS. 4A and 4B (Yb), and FIG. 5 (Sr), it is useful to select conditions where a contour line for the lattice induced clock shift, or their local tangential line, extends parallel to the horizontal axis for the lattice-laser intensity I, even without requiring the lattice induced clock shift value to be zero. Such selection leads to widened acceptable tolerance for the lattice-laser intensity while requiring correction of the lattice induced clock shifts. Therefore, the lattice-laser frequency that makes lattice-induced clock shift $\Delta v_c$ insensitive to the variation of the lattice-laser intensity I is another example of the operational magic frequency within the scope of the embodiment.

1-7. Controlling Polarization of Lattice Laser

Referring back to FIG. 1, preparation of optical lattice with $\xi > 0$ is described. It is possible to build an optical lattice with $\xi > 0$ by placing a polarization element 6 at any position in the light path from the lattice laser 4 to the cavity with the mirrors 42 and 44. Typical polarization element 6 is a combination of a polarizer 62 and a wave plate 64. The wave plate 64 may be a quartz wave plate, for example. It should be noted that polarization of light from the lattice laser 4 may be distorted to have finite degree of circular polarization after passing through a window element 84. This is because the window element 84 is stressed by the pressure difference between the both faces. The polarizing element 6 allows the optical lattice to have desired degree of circular polarization inside of the cavity with the mirror 42 and 44 even in such a circumstance. Note that detection of the clock transition can be carried out easily for those skilled in the art by providing another laser beam for detection, not shown, into the cavity through the window element 84 or 86.

1-8. Variation

Although typical implementations have been described for the embodiment, it is possible to modify the structure of the optical lattice clocks with an operational magic frequency in the present embodiment. The optical lattice formed by the lattice laser 4 in FIG. 1 has been described with a pair of counterpropagating lasers that generates the optical lattice. The optical lattice has an alternating potential along the x axis, which is a one-dimensional optical lattice with a substantial single confinement direction. However, the embodiment of the optical lattice clock with the operational magic frequency can be implemented with additional pair or pairs of lasers, which generate two- or three-dimensional lattice with two or three confinement directions in total. Even in such implementations, the description set forth in the above under a context of one-dimensional optical lattice will be applied if the additional pair or pairs of lasers excite the optical lattice at an operational magic frequency. Note that the operational magic frequency may be modified when the optical lattice has two or three confinement directions, because two- or three-dimensional oscillation modes of atoms may be different from that for Eqs. (2)-(10), which will be reflected to Eq. (13) accordingly. Since quantized atomic oscillation confined to two or three dimensional optical lattice has been extensively studied so far (Non Patent Literature 6), a person skilled in the art can easily modify the relevant equations by following the above description with the help of quantized oscillation mechanics formalities. Therefore, optical lattice clocks with operational magic frequencies for 2- and 3-dimensional lattices are also within the scope of the embodiment.

2. Experimental Confirmation of Operational Magic Frequency with Hg-Based Optical Lattice Clock The feasibility of the above-mentioned concept regarding the uncertainty reduction of a light shift in the clock transition (clock shift) was confirmed with a series of experiments of $^{199}$Hg-based optical lattice clock at the operational magic frequency, the details of which, including the experimental settings and apparatus, have been already reported in Non Patent Literature 7 by the present inventor's group. The contents of Non Patent Literature 7 are incorporated herein by reference in its entirety. In the experiment, the uncertainty of the $^{199}$Hg-based optical lattice clock at the operational magic frequency is compared with $10^{-18}$ level uncertainty of a reference optical lattice clock, which is $^{87}$Sr-based optical lattice clock at non-operational magic frequency. This is because the clock shift by the difference between the light shifts for the excited ($^3P_0$) and ground ($^1S_0$) states is the primary source of the uncertainty of the $^{199}$Hg clock. In addition, the $^{87}$Sr-based reference optical lattice clock at non-operational magic frequency has sufficiently small uncertainty if it is operated at cryogenic temperature (Non Patent Literature 8).

Figure 6:
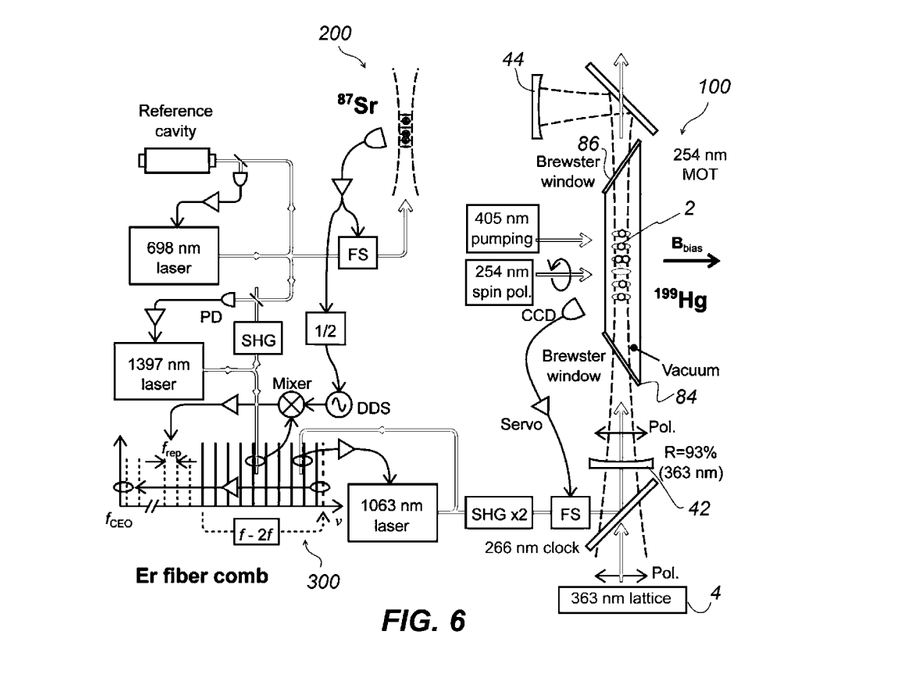
FIG. 6 is a schematic of an experimental setup for $^{199}$Hg-based optical lattice clock at an operational magic frequency used for confirming concept of the operational magic frequency in the embodiment.

FIG. 6 shows an experimental setup for an optical lattice clock 100 at an operational magic frequency using $^{199}$Hg atoms for the experiment. Laser-cooled $^{199}$Hg atoms 2 are loaded into an optical lattice at an operational magic frequency, which corresponds to a wavelength around 363 nm fed by the lattice laser 4. The $^1S_0$-$^3P_0$ clock transition of $^{199}$Hg atoms 2 is interrogated by a clock laser at 266 nm, which is referenced to the Sr clock laser at 698 nm to be used for detecting clock transition of $^{87}$Sr optical lattice clock 200 via an optical frequency comb 300. The following experimental sequences with a cycle time of 1.5 s are conducted. $^{199}$Hg atoms are laser-cooled by a vapor-cell-type magneto-optical trapping (MOT) on the $^1S_0$-$^3P_1$ transition at 254 nm with a natural linewidth Γ=1.3 MHz. Initially, to collect atoms, a MOT laser detuning $\delta v_{MOT} \approx -7\Gamma$ and an intensity≈10 mW/cm$^2$ per beam are applied. After an 860-ms-long atom loading time, the gradient of quadrupole magnetic field is increased from 1 mT/cm to 3 mT/cm to compress the atom cloud. Finally, the laser frequency is tuned to $\delta v_{MOT}$ and then the laser intensity is reduced to further cool the atoms to maximize the transfer efficiency into a lattice trap.

About 3% of the $^{199}$Hg atoms 2 are loaded into a vertically oriented one-dimensional (1D) optical lattice operated at $\lambda_L \approx 362.6$ nm with the maximum trap depth of $U_L \approx 65E_R$, where $E_R/h=h/(2m\lambda_L^2)=7.6$ kHz is the lattice-photon recoil frequency, h is the Planck constant, and m is the mass of $^{199}$Hg atom. Then the trap depth down to $U_L \approx 35E_R$ is temporarily decreased to release the atoms trapped in high-lying axial vibrational states with n≥3. This 1D lattice is formed inside a buildup cavity with a power enhancement factor of ≈10, which consists of two curved mirrors 42 and 44 and a plane folding mirror (see FIG. 6). These cavity mirrors are placed outside the vacuum chamber to prevent vacuum degradation of the mirror coating, while the window element 84 or 86, or the Brewster windows, provide optical access to the vacuum and selective enhancement of the p-polarized light. Atoms 2 in the lattice are spin-polarized by exciting the $^1S_0$-$^3P_1$ transition with the circularly polarized light at a wavelength of 254 nm. A bias magnetic field $B_{bias}$ is applied during the spin polarization and clock excitation. The $^1S_0$-$^3P_0$ transition is excited by a clock laser at 266 nm generated by two-stage frequency doubling of a fiber laser at 1063 nm, which is stabilized to an Er-doped fiber optical frequency comb 300 by a linewidth transfer method. The carrier envelope offset frequency $f_{CEO}$ of the comb is stabilized by using a self-referencing f–2f interferometer. The repetition rate $f_{rep}$ of the comb is then stabilized by referencing a subharmonic (1397 nm) of a Sr clock laser at 698 nm, which is pre-stabilized to a stable reference cavity with instability≈5×10$^{-16}$ at τ=1 s and stabilized to the Sr clock transition for τ>10 s (Non Patent Literature 8). For this operation, charge coupled device (CCD) cameras, frequency shifters (FS), photo diodes (PD), and direct digital synthesizer (DDS) are used.

The clock laser at the wavelength of 266 nm is superimposed on the lattice laser at 363 nm with the same polarization. For the data presented below, the Hg clock is operated with an interrogation time $\tau_i$=40-80 msec so that the frequency stabilization to the atomic transition becomes robust against the variations of experimental conditions for several hours. The atom population $N_S$ in the $^1S_0$ state is determined from the fluorescence by operating the MOT for 20 msec. Then the atoms 2 in the $^3P_0$ state is optically pumped back to the $^1S_0$ state by exciting the $^3P_0$-$^3S_1$ transition at 405 nm to determine the atom population $N_P$ in the $^3P_0$ state. The excited atom fraction [NP/(NS+NP)] is used to stabilize the clock laser frequency. The two π transitions $m_F=\pm\frac{1}{2} \rightarrow m_F=\pm\frac{1}{2}$ are alternately interrogated to average out the 1st-order Zeeman shift and the vector light shift.

Figure 7:
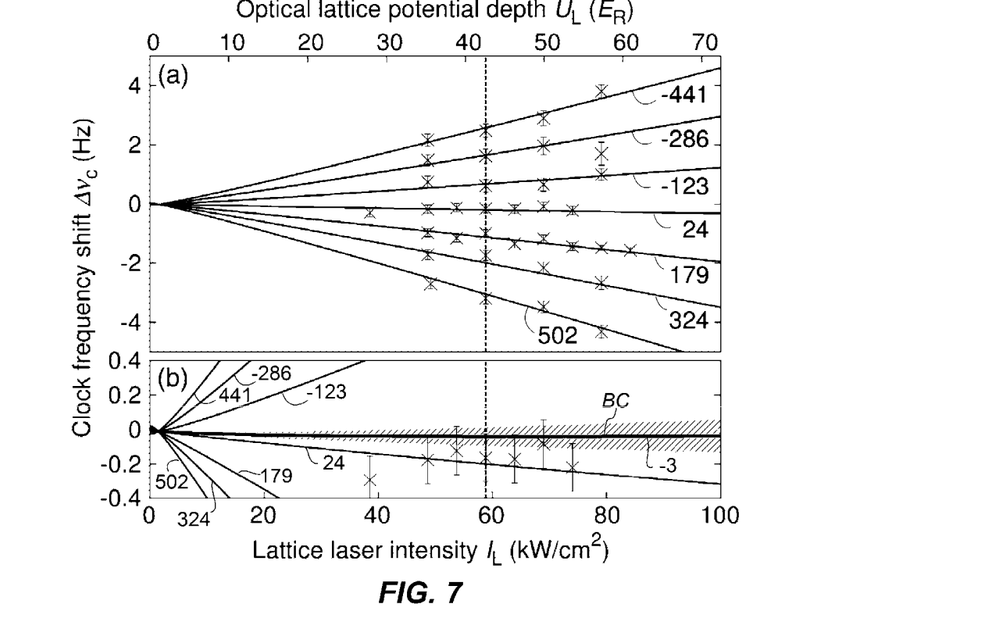
FIG. 7 is a complex graph indicating experimental results for Hg optical lattice clock at an operational magic frequency, as well as fitted curves based on theoretical analysis.

To evaluate the lattice-induced clock shifts $\Delta v_c(I,v)$ as a function of the lattice-laser intensity I and the lattice-laser frequency v, the intensity-dependent clock shift $\delta v_c(I_L, I_0, v)=\Delta v_c(I_L, v)-\Delta v_e(I_0, v)$ in successive measurement cycles by varying the lattice-laser intensity $I_L$ is measured while keeping h=89 kW/cm$^2$ constant. Note that each lattice-laser frequency v is a total of the E1-magic frequency $v_L^{E1}$ (826 855 534 MHz) and each value of detuning δv. Here the intensities $I_L$ and $I_0$ are given in terms of the peak intensity of a single traveling-wave laser that creates the lattice potential depth of $U_L$=$U_{g(e)}$. FIG. 7 shows a clock frequency shift $\Delta v_c(I_L, \delta v_c)$ as a function of the lattice-laser intensity $I_L$ (bottom axis) in a complex graph ((a) and (b)). Corresponding lattice trap depth $U_L$ is given in the top axis. The data plotted in FIG. 7 are taken at seven different lattice-laser frequencies v, which are stabilized to an optical frequency comb, not shown in FIG. 6, within 0.5 MHz, where a carrier envelope offset frequency $f_{CEO}$ of the optical frequency comb is stabilized by using a self-referencing f–2f interferometer. FIG. 7(a) indicates measured data points in crosses, which are used to fit curves for respective detuning values in accordance with the following scheme. Numbers associated with the curves indicate the lattice-laser frequency detuning δv (in MHz) from $v^{E1}$=826 855 534 MHz. The repetition rate $f_{rep}$ of the comb is then stabilized by referencing a subharmonic (1397 nm) of a clock laser at 698 nm of the $^{87}$Sr-based reference optical lattice clock, which is pre-stabilized to a stable reference cavity with instability≈5×10$^{-16}$ at τ=1 sec. Each data point is measured with an uncertainty of 0.2 Hz.

The leading hyperpolarizability shift, or I$^2$ terms depend on $\Delta\beta(\xi)$ in Eq. (13), is estimated to be 2×10$^{-17}$, which is smaller than the measurement uncertainties of <10$^{-16}$, at the maximum lattice-laser intensity of $I_L$=89 kW/cm$^2$. Therefore the hyperpolarizability effects in Eq. (13) other than the leading term are neglected while approximating the clock shift as $$h\Delta v_c(I_L, \delta v, n) \approx -\frac{\partial \Delta \alpha^{E1}}{\partial v} \delta v I_L(r) - \qquad (14)$$

$$\Delta \beta I_L(r)^2 + \left(\frac{\partial \Delta \alpha^{E1}}{\partial v} \delta v - \Delta \alpha^{qm}\right)\left(n + \frac{1}{2}\right)\sqrt{\frac{E_R}{4\alpha_0^{E1}} I_L(r)}.$$

It is to be noted that the Gaussian intensity profile $I_L(r)=I_L \exp(-2r^2/w_0^2)$ of the lattice laser confines atoms radially, where $w_0$ is the beam radius and r is the radial displacement. For the typical lattice potential depth $U_L \approx 43 E_R$, the radial and the axial vibrational frequencies are $v_r=(4 U_L/(\pi^2 m w_0^2))^{1/2} < 100$ Hz and $v_a=(2 U_L/(m\lambda_L^2))^{1/2} < 100$ kHz. Since the typical kinetic energy $<h \times 100$ kHz of the lattice trapped atoms is about $10^3$ times higher than the radial vibrational energy separation $hv_r$, the radial motion could be treated classically. In addition, when calculating an energy eigenvalue $E_{g(e)}^{vib}(I_L(r), n)$ for the n-th axial vibrational state, the axial and radial motion may be decoupled as the adiabaticity condition $v_a \kappa v_r$ is satisfied.

To evaluate the light shift given in Eq. (14), atomic motion in the lattice plays a crucial role, as the axial motion determines the averaged motional state $<n>$ and the radial motion determines the effective lattice-laser intensity $<I_L(r)>$ via the averaged atomic distribution $<r^2>$ in the Gaussian intensity profile. The axial vibrational population in the n=0 state is measured to be 0.7(1) by the difference of the total area of the red and blue motional sideband spectra, while the parentheses denote order of uncertain digit with typical value inside. As atoms in n≥3 are removed in the state preparation, the average occupation is estimated to be $<n>=0.4(2)$ by assuming the atoms are Boltzmann-distributed among n=0, 1, 2 vibrational states. The radial atomic distribution can be inferred from the inhomogeneously broadened sideband line shapes, as the sideband frequency becomes smaller as $<r^2>$ increases due to the Gaussian intensity distribution $I_L \exp(-2r^2/w_0^2)$ of the lattice laser. The blue-sideband frequency $v_b(n, r)=[E_e^{vib}(I_L(r), n+1) - E_g^{vib}(I_L(r), n)]/h$ is given by $$v_b(n,r) \approx v_b \exp(-r^2/w_0^2) - E_R(n+1)/h,$$

where the second term arises from the anharmonicity of the lattice potential and is independent of the lattice intensity. Using the sideband spectrum, the factor of the Gaussian intensity distribution is determined as $<\exp(-2r^2/w_0^2)>=0.8(1)$.

The dipole moment $\alpha_0^{E1}/h=5.5(8)$ kHz/(kW/cm$^2$) at E1 magic frequency was experimentally determined based on the axial motional sideband frequency, where the uncertainty is given by the measurement uncertainty of the lattice-laser intensity. The calculated value $\Delta \alpha^{qm}/h=8.25$ mHz/(kW/cm$^2$) and $\Delta\beta/h=-2.2$ μHz/(kW/cm$^2$)$^2$. The entire data are then fit to Eq. (13) (see FIG. 7), where a multiple regression analysis taking $I_L$ and $v$ as explanatory variables and $\Delta v_c$ as a response variable. This determines the E1-magic frequency of $v^{E1}=826$ 855 534(9) MHz and $(1/h)(\partial \Delta \alpha^{E1}/\partial v)=1.5(4) \times 10^{-10}/(kW/cm^2)$.

For the measurement of Hg clock frequency, a detuning of −3 MHz is adopted, that is, the lattice-laser frequency v is set to $v^{E1}-3$ MHz=826 855 531 MHz so that the lattice-induced clock shift $\Delta v_c(I_L,v)$ becomes insensitive, i.e., $[\partial \Delta v_c(I_L,v)/\partial I_L]|_{IL=Iop}=0$, to the variation of the lattice intensity around $I_{op}=59(10)$ kW/cm$^2$. FIG. 7(b) indicates an enlarged view for the vertical axis of FIG. 7(a). For $\delta v=-3$ MHz used for the ratio measurements, the estimated clock frequency shift and uncertainty are shown by curve BC and hatched region respectively. The lattice intensity operated ($I_L \approx 59$ kW/cm$^2$ or $U_L \approx 43 E_R$) is shown by a dashed line. The lattice-induced clock shift is estimated to be $\Delta v_c=-0.04(7)$ Hz corresponding to the fractional frequency shift of $-4(6) \times 10^{-17}$, whose uncertainty is mainly attributed to the statistical uncertainty of the present measurements. An analysis omitting the nonlinear terms in Eq. (14) gives a consistent result within the uncertainty. In order to further investigate the lattice-induced clock shift, experimental determinations of $\Delta\beta$ and $\Delta \alpha^{qm}$ will be crucial.

The $^{199}$Hg-based optical lattice clock at operational magic frequency, or −3 MHz detuned from its E1-magic frequency, requires correction to the clock transition of $26.9 \times 10^{-17}$ with an uncertainty of $7.2 \times 10^{-17}$. The $^{199}$Hg-based optical lattice clock at operational magic frequency suffers from more significant shifts and uncertainty in the clock transition frequency than those for the reference optical lattice clock, or $^{87}$Sr-based optical lattice clock, whose overall correction to the clock transition frequency is $-17.0 \times 10^{-17}$ with an uncertainty of $0.7 \times 10^{-17}$. However, it is to be noted that the lattice-induced clock shift is known to be the primary source of the uncertainty of the $^{199}$Hg clock (Non Patent Literature 9). It follows that the experimental facts described above evidence that the $^{199}$Hg-based optical lattice clock at the operational magic frequency mitigates correction and uncertainty when operating $^{199}$Hg-based optical lattice clocks, and it has been confirmed that the strategy of reducing lattice-induced clock shift by way of the operational magic frequency actually worked.

3. Further Reduction of Clock Shift

Figure 8:
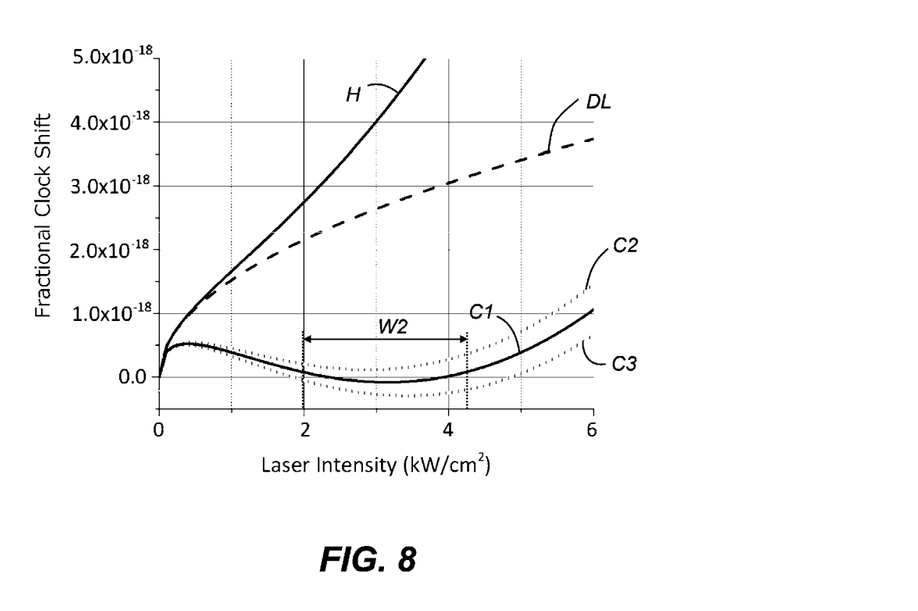
FIG. 8 is a graph showing the applicability of the strategies to $^{87}$Sr-based optical lattice clock.

The strategies presented and experimentally confirmed in the above can be embodied for the purpose of further reduction of the clock shifts in the case of Yb or Sr atoms. FIG. 8 is a graph showing the applicability of the strategies to $^{87}$Sr-based optical lattice clock. The graph shows a partly theoretical analysis based on experimental results $^{87}$Sr-based optical lattice clock. The fractional clock shifts (vertical) depending on the lattice-laser intensity I (horizontal) are plotted for each condition in terms of the deviation from the E1-magic frequency and related effects. The curve DL indicates estimated results based on the inventor's experimental results for a $^{87}$Sr-based optical lattice clock whose optical lattice is operated at an E1-magic frequency $v^{E1}=\omega_m^{E1}/2\pi=368$ 554483.5 (2.5) MHz, which is a typical but preliminary value for the $^{87}$Sr-based optical lattice clock. The estimation is made based on the differential multipolar polarizability $\Delta \alpha^{qm}=\alpha_e^{qm}-\alpha_g^{qm}$, without introducing the hyperpolarizability effects $\Delta\beta$. It should be noted that the fractional clock shifts range $10^{-18}$ level for the plotted range, and will increase monotonously as the lattice-laser intensity increases. If the estimation is made based on an analysis that merely adopts the mutipolarizability and hyperpolarizability at a time (Non Patent Literature 10) while keeping the lattice-laser frequency to the E1-magic frequency, the fractional clock shift upsurges as the lattice-laser intensity I increases, as indicated with line H. Therefore, if the lattice-laser frequency is fixed to the E1-magic frequency, it is the only approach for one to reduce the lattice laser intensity I as weak as possible, for obtaining $10^{-19}$ level accuracy.

In contrast, when the operational magic frequency is adopted in accordance with the presented strategy, i.e., the lattice laser frequency is shifted to $v^{E1}+3.15$ MHz (curve C1 in FIG. 8), the fractional clock shift approaches below $10^{-18}$ level in the middle of the practical intensity range for the lattice laser I. It should be noted that the intensity values for the lattice laser I plotted in FIG. 8 denote single lattice laser intensity values. Furthermore, the operational magic frequency allows for practical tolerances for the frequency itself. When a possible deviation to the lattice laser frequency of ±0.15 MHz is assumed, the fractional clock shifts remain below $10^{-18}$ level, as depicted with curves C2 and C3 for $v^{E1}+3.00$ MHz and $v^{E1}+3.30$ MHz, respectively. As indicated in the intensity range W2 in FIG. 8, the curve C1 remains insensitive to the variation of the lattice-laser intensity I while keeping a fractional clock shift of $10^{-19}$ level over a doubled intensity range. Even when the lattice laser frequency fractuates, the fractional clock shift could remain below $5 \times 10^{-19}$ as indicated by curves C2 and C3, which are also relatively insensitive to the variation of the lattice-laser intensity I in the intensity range W2. Although the estimated results in FIG. 8 are obtained partly based on the theoretically estimated values on the E1-magic frequency $v^{E1}$, differential multipolar polarizability $\Delta \alpha^{qm}$ and hyperpolarizability $\Delta \beta$ can be determined through experiments in nature. In addition to that, hyperpolarizability $\Delta \beta$ can be tuned as necessity by controlling polarization states of the lattice laser, allowing further adjustment of the clock shift to the realistic operation range of the lattice-laser intensity I. Therefore, the strategy using the operational magic frequency is applicable to the clock shift reduction down below $10^{-18}$ level or even to $10^{-19}$. Moreover, the $^{87}$Sr-based optical lattice clock operated at the operational magic frequency may well be a promising candidate for the sub $10^{-18}$ level or $10^{-19}$ level accuracy time reference standard.

4. Summary

Details for optical lattice clocks operated with an operational magic frequency are described. According to the presented approach, the lattice-induced clock shift may be reduced than ever before into a different order of magnitude, such as less than $1 \times 10^{-18}$ depending on the setting of the operational parameters. The optical lattice clock with the operational magic frequency may be operated in a well-defined manner over an extended range of lattice intensity. This may be achieved when the polarizabilities are determined experimentally, where recently demonstrated clock reproducibility at $2 \times 10^{-18}$ can be a powerful tool. When the parameters are defined and a certain degree of circular polarization is necessary, a specifically designed polarization element, such as a wave plate may be used for attaining the minimized clock uncertainty.

As seen from the above, the embodiment of the present disclosure is specifically described. The above-mentioned embodiments are described for the purpose of illustrating the inventive solution; therefore, the scope of the disclosure of the present application should be defined on the basis of the scope of claims. In addition, any modification within the scope of the present disclosure as well as other combination of the embodiment is also included in the scope of the claims.

REFERENCE SIGNS LIST 100 optical lattice clock
200 $^{87}$Sr optical lattice clock (reference optical lattice clock)
300 optical frequency comb
2 atoms
42, 44 mirror
6 polarizing element
62 polarizer
64 wave plate
82 vacuum chamber
84, 86 window element

The invention claimed is:

1. An optical lattice clock comprising:
   atoms capable of making a clock transition between two levels of electronic states; and
   a laser light source at an operational magic frequency for generating at least a pair of counterpropagating laser beams, each of which having a lattice-laser intensity I, wherein the pair of counterpropagating laser beams forms an optical lattice potential for trapping the atoms at around antinodes of a standing electromagnetic wave of the counterpropagating laser beams,
   wherein the operational magic frequency is a frequency that makes a lattice-induced clock shift of the clock transition insensitive to variation $\Delta I$ of the lattice-laser intensity I, while allowing for nonlinear dependence of the lattice-induced clock shift on the lattice-laser intensity I, where the lattice-induced clock shift is a shift in a frequency for the clock transition of the atoms caused by the variation $\Delta I$ of the lattice-laser intensity I.

2. The optical lattice clock according to claim 1,
   wherein the lattice-induced clock shift is given as a function of the lattice-laser intensity I,
   wherein the optical lattice clock is operated with a predetermined operational lattice-laser intensity $I_{op}$ for the lattice-laser intensity I, and
   wherein the operational magic frequency is a frequency that makes derivative of the lattice-induced clock shift at around the predetermined operational lattice-laser intensity $I_{op}$ substantially equal to zero.

3. The optical lattice clock according to claim 2,
   wherein the operational magic frequency is a frequency that is detuned from an E1 magic frequency, the E1 magic frequency being a frequency of the laser light source that exactly matches two electric-dipole components for the two levels of the electronic states.

4. The optical lattice clock according to claim 1,
   wherein the operational magic frequency is selected to be a frequency that makes the lattice-induced clock shift smaller than a predetermined uncertainty level.

5. The optical lattice clock according to claim 4,
   wherein the lattice-induced clock shift is given as a function of the lattice-laser intensity I,
   wherein the optical lattice clock is operated with a predetermined operational lattice-laser intensity $I_{op}$ for the lattice-laser intensity I, and
   wherein the operational magic frequency is a frequency that makes both of the lattice-induced clock shift at around the predetermined operational lattice-laser intensity $I_{op}$ and derivative of the lattice-induced clock shift at around the predetermined operational lattice-laser intensity $I_{op}$ substantially equal to zero at a time.

6. The optical lattice clock according to claim 1,
   wherein polarization states of the pair of counterpropagating laser beams are set in such a manner that the lattice-induced clock shift becomes insensitive to the variation $\Delta I$ of the lattice-laser intensity I.

7. The optical lattice clock according to claim 6 further comprising:
   a polarization element for adjusting polarization states of the pair of counterpropagating laser beams,
   wherein the polarization states adjusted by the polarization element are adjusted to have a predetermined degree of circular polarization.

8. The optical lattice clock according to claim 7,
wherein the operational magic frequency and the degree of circular polarization states are determined such that accepted tolerance for the lattice intensity I is increased.

9. The optical lattice clock according to claim 1,
wherein the atoms are selected from a group consisting of atoms and ions that make the clock transition between long-lived states.

10. The optical lattice clock according to claim 9,
wherein the atoms are selected from a group consisting of ytterbium (Yb), mercury (Hg), strontium (Sr), cadmium (Cd), zinc (Zn), magnesium (Mg), and calcium (Ca).

11. The optical lattice clock according to claim 4 further comprising:
a polarization element for adjusting polarization states of the pair of counterpropagating laser beams,
wherein the atom is mercury (Hg),
wherein the polarization states of the pair of counterpropagating laser beams are adjusted to have a predetermined degree of circular polarization for Hg.

12. The optical lattice clock according to claim 4 further comprising:
a polarization element for adjusting polarization states of the pair of counterpropagating laser beams,
wherein the atom is ytterbium (Yb),
wherein the polarization states of the pair of counterpropagating laser beams are adjusted to have a predetermined degree of circular polarization for Yb.

13. The optical lattice clock according to claim 4 further comprising:
a polarization element for adjusting polarization states of the pair of counterpropagating laser beams,
wherein the atom is strontium (Sr),
wherein the polarization states of the pair of counterpropagating laser beams are linear polarization with a degree of circular polarization of 0.

14. A time reference apparatus using an optical lattice clock comprising:
atoms capable of making a clock transition between two levels of electronic states; and
a laser light source at an operational magic frequency for generating at least a pair of counterpropagating laser beams, each of which having a lattice-laser intensity I, wherein the pair of counterpropagating laser beams forms an optical lattice potential for trapping the atoms at around antinodes of a standing electromagnetic wave of the counterpropagating laser beams, wherein the operational magic frequency is a frequency that makes a lattice-induced clock shift of the clock transition insensitive to variation $\Delta I$ of the lattice-laser intensity I, while allowing for nonlinear dependence of the lattice-induced clock shift on the lattice-laser intensity I, where the lattice-induced clock shift is a shift in a frequency for the clock transition of the atoms caused by the variation $\Delta I$ of the lattice-laser intensity I.

15. A method for operating an optical lattice clock, comprising steps of:
providing atoms capable of making a clock transition between two levels of electronic states; and
supplying at least a pair of counterpropagating laser beams by a laser light source at an operational magic frequency, each of the pair of counterpropagating laser beams having a lattice-laser intensity I, wherein the pair of counterpropagating laser beams forms an optical lattice potential for trapping the atoms at around antinodes of a standing electromagnetic wave of the counterpropagating laser beams,
wherein the operational magic frequency is a frequency that makes a lattice-induced clock shift of the clock transition insensitive to variation $\Delta I$ of the lattice-laser intensity I, while allowing for nonlinear dependence of the lattice-induced clock shift on the lattice-laser intensity I, where the lattice-induced clock shift is a shift in a frequency for the clock transition of the atoms caused by the variation $\Delta I$ of the lattice-laser intensity I.

* * * * *